US010749140B2

(12) United States Patent
Park et al.

(10) Patent No.: US 10,749,140 B2
(45) Date of Patent: Aug. 18, 2020

(54) ORGANIC LIGHT-EMITTING DISPLAY DEVICE

(71) Applicant: LG Display Co., Ltd., Seoul (KR)

(72) Inventors: Jongchan Park, Paju-si (KR); Hyunchul Um, Paju-si (KR); JeeHwan Oh, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 58 days.

(21) Appl. No.: 15/826,497

(22) Filed: Nov. 29, 2017

(65) Prior Publication Data

US 2018/0151838 A1    May 31, 2018

(30) Foreign Application Priority Data

Nov. 29, 2016 (KR) .................. 10-2016-0160844

(51) Int. Cl.
*H01L 51/52* (2006.01)
*H01L 27/32* (2006.01)
*G06F 3/041* (2006.01)

(52) U.S. Cl.
CPC ........ *H01L 51/5253* (2013.01); *G06F 3/0412* (2013.01); *H01L 27/323* (2013.01); *H01L 27/3258* (2013.01); *H01L 27/3276* (2013.01); *H01L 51/5256* (2013.01); *G06F 2203/04103* (2013.01)

(58) Field of Classification Search
CPC .............. H01L 27/323; H01L 27/3258; H01L 27/3276; H01L 51/5253; H01L 51/5256; G06F 3/0412; G06F 2203/04103
See application file for complete search history.

(56) References Cited

U.S. PATENT DOCUMENTS

| 2008/0079360 | A1* | 4/2008 | Kubota | ................ H01L 51/5246 313/505 |
| 2015/0014636 | A1* | 1/2015 | Kang | ..................... H01L 51/56 257/40 |
| 2015/0060806 | A1* | 3/2015 | Park | .................... H01L 51/5253 257/40 |
| 2015/0091030 | A1* | 4/2015 | Lee | ..................... H01L 27/3246 257/91 |

(Continued)

FOREIGN PATENT DOCUMENTS

| CN | 104425760 A | 3/2015 |
| CN | 105280677 A | 1/2016 |

(Continued)

*Primary Examiner* — Amare Mengistu
*Assistant Examiner* — Crystal Mathews
(74) *Attorney, Agent, or Firm* — Seed IP Law Group LLP

(57) ABSTRACT

Disclosed herein is an organic light-emitting display (OLED) device including: a substrate comprising an active area and an inactive area surrounding the active area; a first planarization layer; a second planarization layer; an organic light-emitting element; an encapsulation layer comprising a first inorganic layer, a second inorganic layer and a first organic member; a first structure in the inactive area and comprising a first support layer made of the same material as the first planarization layer or the second planarization layer, a second structure in the inactive area and comprising a second support layer made of the same material as the first planarization layer or the second planarization layer.

13 Claims, 9 Drawing Sheets

(56) References Cited

U.S. PATENT DOCUMENTS

| | | |
|---|---|---|
| 2015/0228927 A1* | 8/2015 | Kim .................... H01L 51/5203 |
| | | 257/40 |
| 2015/0372253 A1 | 12/2015 | Hong et al. |
| 2015/0380685 A1* | 12/2015 | Lee .................... H01L 51/5243 |
| | | 257/40 |
| 2016/0043346 A1 | 2/2016 | Kamiya et al. |
| 2016/0079564 A1 | 3/2016 | Shim et al. |
| 2016/0204373 A1 | 7/2016 | Park |
| 2016/0260928 A1 | 9/2016 | Choi et al. |
| 2016/0268540 A1 | 9/2016 | Kim et al. |
| 2016/0268547 A1* | 9/2016 | Kim .................... H01L 51/5256 |
| 2016/0307971 A1 | 10/2016 | Jeon |
| 2016/0365398 A1 | 12/2016 | Kim et al. |
| 2017/0033312 A1 | 2/2017 | Kim et al. |
| 2017/0053973 A1* | 2/2017 | Park .................... H01L 51/5246 |
| 2017/0277288 A1* | 9/2017 | Choi .................... H01L 51/0097 |
| 2017/0287995 A1 | 10/2017 | Kim et al. |
| 2017/0331058 A1 | 11/2017 | Seo et al. |
| 2018/0059862 A1* | 3/2018 | Zeng ....................... G06F 3/044 |
| 2018/0061728 A1* | 3/2018 | Chen .................... H01L 51/5246 |
| 2018/0102502 A1* | 4/2018 | Kim .................... H01L 51/5253 |
| 2018/0122890 A1* | 5/2018 | Park .................... H01L 27/3248 |
| 2018/0138450 A1 | 5/2018 | Park et al. |
| 2018/0151838 A1* | 5/2018 | Park ....................... G06F 3/0412 |

FOREIGN PATENT DOCUMENTS

| | | |
|---|---|---|
| CN | 105742322 A | 7/2016 |
| CN | 106057853 A | 10/2016 |
| EP | 2 960 962 A1 | 12/2015 |

* cited by examiner

ORGANIC LIGHT-EMITTING DISPLAY DEVICE

CROSS-REFERENCE TO RELATED APPLICATIONS

This application claims the priority of Korean Patent Application No. 10-2016-0160844, filed Nov. 29, 2016, in the Korean Intellectual Property Office, the disclosure of which is incorporated herein by reference.

BACKGROUND

Technical Field

The present disclosure relates to an organic light-emitting display (OLED) device, and more specifically to an OLED device having an even surface at inactive area for disposing lines.

Description of the Related Art

As information technology has developed display devices that represent information contained in electrical signals in the form of visual images are in widespread use. In accordance with this, a various display panels that can be implemented in devices which are thinner, lighter and consume less power have been developed to replace existing CRTs (Cathode Ray Tubes) so fast.

Examples of such display devices include LCD (Liquid Crystal Displays), OLED (Organic Light-Emitting Displays), ELD (Electro Luminescence Displays), EPD (Electrophoretic Displays, Electronic Paper Displays), EWD (Electro-Wetting Display) device, etc. Among these, an OLED emerges as the next generation display devices having a self-emitting characteristic since it exhibits good performance over LCD in terms of viewing angle, contrast ratio, response time, power consumption, etc.

Recently, as OLED have smaller size and higher resolution, the number of required lines is increased. However, the space for disposing such lines becomes insufficient in order to reduce the size and thickness of displays, and to narrow or eliminate the bezel of displays (narrow bezel or zero bezel). Under the circumstances, it is an important issue to make a space for disposing lines and other elements.

BRIEF SUMMARY

An object of the present disclosure is to reduce a level difference of structures between an active area and inactive area by disposing a structure in the inactive area.

Another object of the present disclosure is to provide an OLED device having an area with an even surface in the inactive area. Yet an object of the present disclosure is to form the structure disposed in the inactive area for providing the even surface in the inactive area together with the elements in the active area.

It should be noted that objects of the present disclosure are not limited to the above-described objects, and other objects of the present disclosure will be apparent to those skilled in the art from the following descriptions.

According to an example embodiment of the present disclosure, there is provided an organic light-emitting display (OLED) device. The OLED device includes: a substrate comprising an active area and an inactive area surrounding the active area; a first planarization layer above circuit elements in the active area and in the inactive area; a second planarization layer on the first planarization layer; an organic light-emitting element on the second planarization layer in the active area; an encapsulation layer over the organic light-emitting element and the second planarization layer, where the encapsulation layer comprises a first inorganic layer, a second inorganic layer and a first organic member between the first inorganic layer and the second inorganic layer; a first structure spaced apart from the first planarization layer in the inactive area and comprising a first support layer made of the same material as the first planarization layer or the second planarization layer, and a first wall on the first support layer; a second structure on an outer side of the first structure in the inactive area, where the second structure comprises a second support layer made of the same material as the first planarization layer or the second planarization layer, and a second wall on the second support layer; and a second organic member in a space between the first wall and the second wall.

According to another example embodiment of the present disclosure, an organic light-emitting display (OLED) device includes: a substrate comprising an active area and an inactive area surrounding the active area; a planarization layer in the active area and in the inactive area, where the planarization layer comprises a plurality of layers; an organic light-emitting element on the planarization layer; an encapsulation layer covering the organic light-emitting element and comprising a first organic material; and a dual-buffer structure in the inactive area on an outer periphery of the planarization layer. The dual-buffer structure reduces a height difference between a top surface of the dual-buffer structure and a top surface of the first organic material in the inactive area to suppress overflow of the first organic material, and the dual-buffer structure comprises a second organic material in a gap of the dual-buffer structure to make the top surface of the dual-buffer structure even.

According to example embodiments of the present disclosure, the flow of an organic material in an organic member of an encapsulation layer in an inactive area of an OLED device can be suppressed by disposing a structure in the inactive area.

According to example embodiments of the present disclosure, an OLED device has an area with an even surface in an inactive area where a conductive line is disposed, so that the conductive line can be utilized as a variety of lines.

According to example embodiments of the present disclosure, a structure disposed in an inactive area can be formed together with elements disposed in an active area without any additional process or cost.

It should be noted that effects of the present disclosure are not limited to those described above and other effects of the present disclosure will be apparent to those skilled in the art from the following descriptions.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
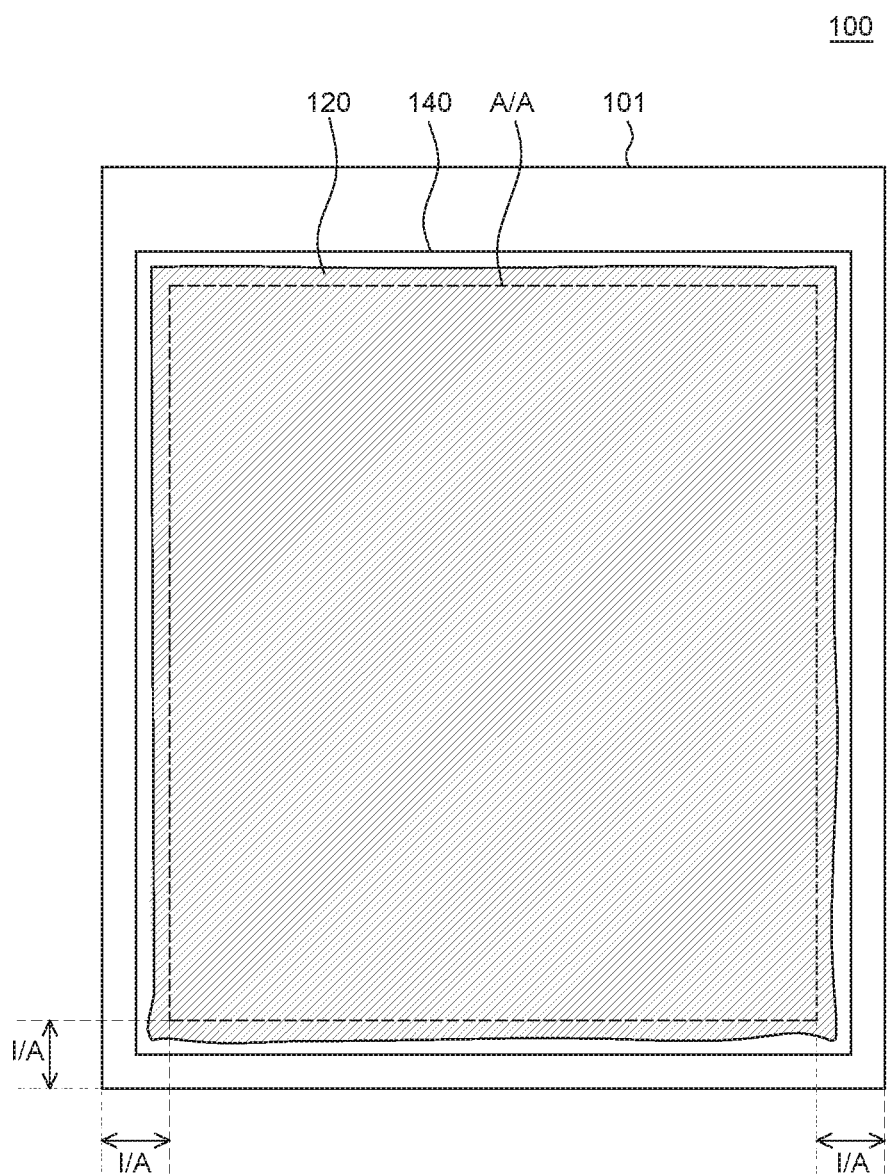
FIG. 1 is a plan view for illustrating an organic light-emitting display (OLED) device according to an example embodiment of the present disclosure.

Advantages and features of the present disclosure and methods to achieve them will be elucidated from example embodiments described below in detail with reference to the accompanying drawings. However, the present disclosure is not limited to example embodiments disclosed herein but may be implemented in various different ways. The example embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, descriptions on well-known technologies may be omitted in order not to unnecessarily obscure the gist of the present disclosure. It is to be noted that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an," "the," this includes a plural of that noun unless specifically stated otherwise. In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used. As used herein, a phrase "an element A on an element B" refers to that the element A may be disposed directly on the element B and/or the element A may be disposed indirectly on the element B via another element C. As used herein, phrases "an element A connected to an element B" or "an element A coupled with an element B" refer to that the element A may be directly connected to/coupled with the element B, that that another element C may be interposed between the element A and the element B, and/or that the element A may be indirectly connected to/coupled with the element B via another element C.

The terms first, second and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

Like reference numerals denote like elements throughout the descriptions.

The drawings are not to scale and the relative dimensions of various elements in the drawings are depicted schematically and not necessarily to scale.

Features of various example embodiments of the present disclosure may be combined partially or totally. As will be clearly appreciated by those skilled in the art, technically various interactions and operations are possible. Various example embodiments can be practiced individually or in combination.

Since the material of an organic member of an encapsulation layer typically has a low viscosity, it is required to control the flow of the material of the organic member. In order to efficiently control the flow of the organic member in the encapsulation layer, structures are disposed in the inactive area of the substrate. However, such typical structures have limitation in controlling the flow of the organic member because they are formed by sequentially stacking a bank, a spacer, etc.

In addition, various components such as electrodes and lines may be disposed in the active area as required by the high resolution of OLED devices. In doing so, there may be a level difference between the active area and the inactive area. Therefore, it is difficult to control the flow of the organic member of the encapsulation layer with typical structures.

In addition, when a touch sensing electrode is disposed on the encapsulation layer of the OLED device, a touch line for transmitting/receiving a signal to/from the touch sensing electrode may be disposed in the inactive area of the substrate. There may be a level difference between the active area and the inactive area by various components arranged in the active area of the substrate. Therefore, the touch line formed on the encapsulation layer may not be normally formed or may be disconnected.

In view of the above, the inventors of the application have studied a method for controlling the flow of an organic member of an encapsulation layer while suppressing the disconnection of the touch line in order to dispose a touch sensing electrode for sensing a touch pressure of a user in an OLED device.

Hereinafter, example embodiments of the present disclosure will be described in detail with reference to the accompanying drawings.

FIG. 1 is a plan view for illustrating an organic light-emitting display (OLED) device according to an example embodiment of the present disclosure. FIG. 1 shows a substrate 101, an encapsulation layer 120 and a barrier film 140 among various elements of the OLED device 100 for convenience of illustration. The other elements of the OLED device 100 will be described with reference to FIGS. 2. and 3.

As shown in FIG. 1, the OLED display 100 includes an active area A/A, in which an array of pixels is disposed. Although the OLED device 100 is shown as having one active area A/A, it may have more than one active areas.

An inactive area I/A may be disposed around the active area A/A. Specifically, the inactive area I/A may surround the active area A/A. Although the inactive area I/A is shown as surrounding the rectangular active area A/A, the shape and arrangement of the active area A/A and the inactive area I/A are not limited thereto. For example, when the display device is employed in a wearable device worn on a user, it may have a circular shape like a watch. In addition, the idea of example embodiments of the present disclosure may be employed by free-form display devices applicable to instrument clusters for vehicles, etc.

Each pixel in the active area A/A may be associated with a pixel driving circuit. The pixel driving circuit may include at least one switching transistor and at least one driving transistor. Each pixel driving circuit may be electrically connected to signal lines such as a gate line and a data line so as to communicate with a gate driver, a data driver, etc., disposed in the inactive area I/A.

The gate driver may be implemented as a thin-film transistor in the inactive area I/A. The driver may be referred to as GIPs (gate-in-panel). The data driver may also be implemented in the inactive area I/A. In addition, some components such as a data driver IC may be mounted on a separated PCB and may be coupled with a connection interface (a pad, a bump, a pin, etc.) disposed in the inactive area I/A via a circuit film such as a FPCB (flexible printed circuit board), a COF (chip-on-film), a TCP (tape-carrier-package), etc. The PCB may be, but is not limited to, disposed on the rear surface of the substrate 101.

The OLED device 100 may include a variety of additional elements for generating various signals or for driving pixels in the active area A/A. The additional elements for driving the pixels may include an inverter circuit, a multiplexer, an electrostatic discharge (ESD) circuit, etc. The OLED device 100 may include additional elements associated with other features than driving the pixels. For example, the OLED device 100 may include additional elements for providing a touch sense feature, a user authentication feature (e.g., fingerprint recognition feature), a multi-level pressure sense feature, a tactile feedback feature, etc.

The substrate 101 supports thereon a variety of elements of the OLED device 100. The substrate 101 may be made of a transparent, insulative material such as glass, plastic, etc. But, it is not limited thereto.

An organic light-emitting element 130 may be disposed on the substrate 101 in the active area A/A. The encapsulation layer 120 may be disposed on the organic light-emitting element 130 to cover it. The encapsulation layer 120 may seal the organic light-emitting element 130. The encapsulation layer 120 protects the organic light-emitting element 130 from moisture or oxygen. The barrier film 140 is disposed on the encapsulation layer 120. The organic light-emitting element 130, the encapsulation layer 120 and the barrier film 140 will be described in detail below with reference to FIGS. 2 and 3.

The OLED device 100 may include a plurality of pixels, and each pixel may include a plurality of sub-pixels. The sub-pixel is a minimum unit for representing one color. One sub-pixel may include a plurality of transistors, capacitors, and a plurality of lines. One sub-pixel may be of a 2T1C type including two transistors and one capacitor, but this is not limiting. The sub-pixel may be of 4T1C, 7T1C or 6T2C type, for example. In this regard, the number ahead of T denotes the number of transistors disposed in one sub-pixel, and the number ahead of C denotes the number of capacitors disposed in one sub-pixel.

Figure 2:
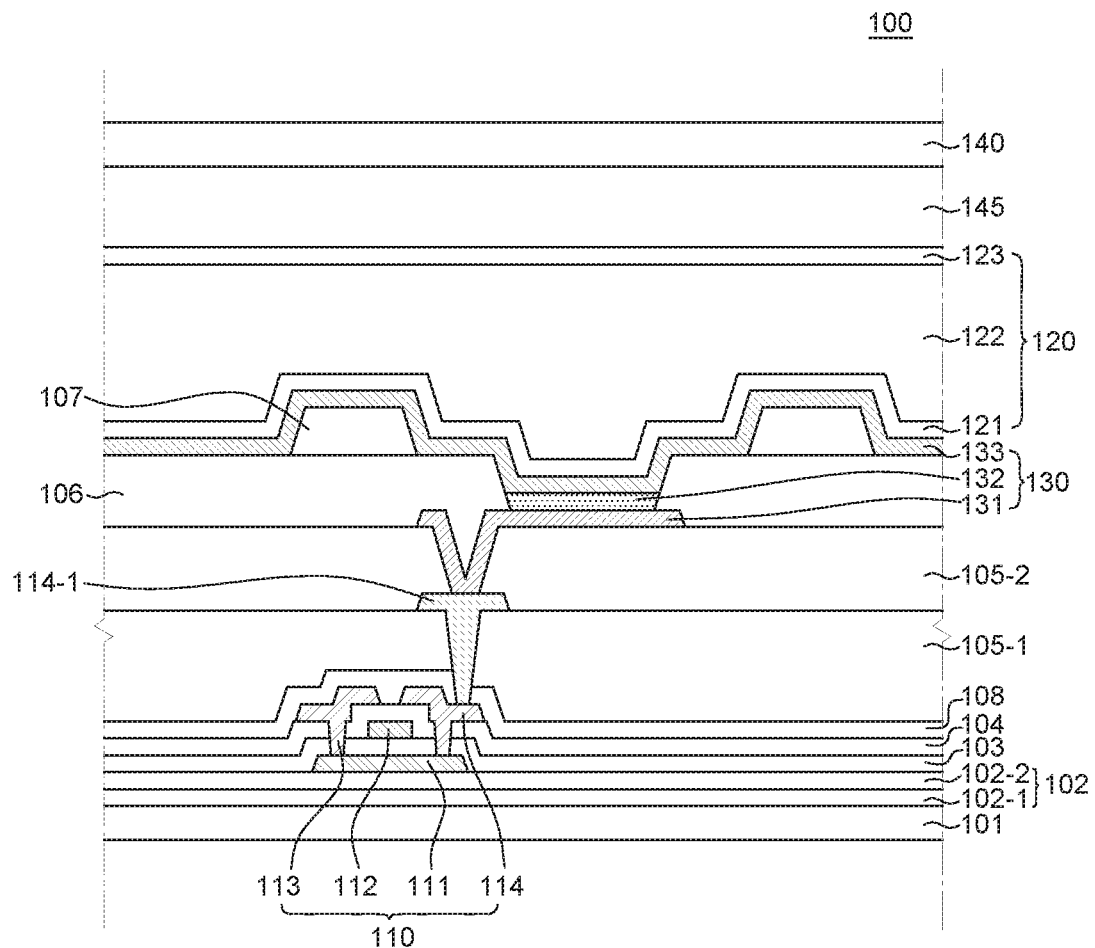
FIG. 2 is a cross-sectional view of a portion of an active area of an OLED device according to an example embodiment of the present disclosure.

FIG. 2 is a cross-sectional view of a part of an active area of an OLED device according to an example embodiment of the present disclosure. FIG. 2 is a schematic cross-sectional view of a region corresponding to one pixel of the active area A/A of the OLED device 100.

As shown in FIG. 2, the substrate 101 supports thereon various elements of the OLED device 100. The substrate 101 may be made of a transparent, insulative material such as glass, plastic, etc. When the substrate 101 is made of a plastic material, materials such as polyimide (PI)-based or polycarbonate (PC)-based materials may be used. Particularly, polyimide (PI) is commonly used since it can be applied to a high-temperature process and can be coated.

A buffer layer 102 is disposed on the substrate 101. The buffer layer 102 protects electrodes and electric lines from impurities such as alkali ions that leak out of the substrate 101 or other layers. The buffer layer 102 may be made of silicon oxide (SiOx), silicon nitride ($SiN_x$), or a multiple layers thereof.

The buffer layer 102 includes a multi-buffer 102-1 and an active buffer 102-2. The multi-buffer 102-1 may be formed by alternately stacking silicon oxide ($SiO_2$) and silicon nitride ($SiN_x$), and may suppress the diffusion of moisture and/or oxygen permeating into the substrate 101. The active buffer 102-2 protects the active layer 111 of a thin-film transistor 110 and can suppress various kinds of defects. The active buffer 102-2 may be formed of amorphous silicon (a-Si), etc. Although the buffer layer 102 is shown as including both of the multi-buffer 102-1 and the active buffer 102-2, it is merely illustrative. The buffer layer 102 may include only one of them. Also, the buffer layer 102 may be eliminated.

The thin-film transistor 110 is disposed on the buffer layer 102. The thin-film transistor 110 may include an active layer 111, a gate electrode 112, a source electrode 113, and a drain electrode 114.

The active layer 111 is disposed on the buffer layer 102. The active layer 111 works as the channel of the thin-film transistor 110. The active layer 111 may be formed of various materials such as polysilicon, amorphous silicon, oxide semiconductor, etc.

A gate insulating layer 103 is disposed on the active layer 111. The gate insulating layer 103 is disposed so as to insulate the active layer 111 from the gate electrode 112. The gate insulating layer 103 is made of an inorganic material such as, for example, silicon oxide and silicon nitride, and may be made up of a single layer or multiple layers.

The gate electrode 112 is disposed on the gate insulating layer 103.

An interlayer insulating layer 104 is disposed on the gate electrode 112. The interlayer insulating layer 104 is made of an inorganic material such as, for example, silicon oxide and silicon nitride, and may be comprised of a single layer or multiple layers.

The source electrode 113 and the drain electrode 114 are disposed on the interlayer insulating layer 104. Each of the source electrode 113 and the drain electrode 114 is electrically connected to the active layer 111 via a contact hole formed in the interlayer insulating layer 104 and in the gate insulating layer 103. Although the thin-film transistor 110 is shown as a co-planar structure for convenience of illustration, this is not limited thereto.

A passivation layer 108 is disposed on the source electrode 113 and the drain electrode 114. The passivation layer 108 may protect the source electrode 113 and the drain electrode 114. The passivation layer 108 is made of an inorganic material such as, for example, silicon oxide and silicon nitride, and may be comprised of a single layer or multiple layers. It is to be noted that the passivation layer 108 is not an essential element and thus may be eliminated.

Although FIG. 2 shows only the driving thin-film transistor 110 among various devices for driving the organic light-emitting element 130 for convenience of illustration, this is not limited thereto. That is, various devices such as a switching thin-film transistor for driving the organic light-emitting element 130, a thin-film transistor for compensation, a capacitor, etc. may be disposed in the active area A/A, which may configure circuit elements 112' and 114'. The circuit elements 112' and 114' may be disposed in the inactive area I/A as well as in the active area A/A.

A first planarization layer 105-1 is disposed on the thin-film transistor 110. The first planarization layer 105-1 is an insulating layer for providing a flat surface over the circuit elements 112' and 114' including the thin-film transistor 110 and protecting the thin-film transistor 110. The first planarization layer 105-1 may be formed of at least one of an acrylic-based resin, an epoxy resin, a phenol resin, a polyamide-based resin, a polyimide-based resin, an unsaturated polyester resin, a polyphenylene-based resin, polyphenylene sulfide-based resin, etc. But this is not limited thereto.

On the first planarization layer 105-1, various metal layers that work as lines or electrodes may be disposed. For example, a connection electrode 114-1 for electrically connecting the thin-film transistor 110 with an anode 131 may be disposed on the first planarization layer 105-1.

The second planarization layer 105-2 is disposed on the first planarization layer 105-1. The second planarization layer 105-2 provides a flat surface over the first planarization layer 105-1. The second planarization layer 105-2 may be formed of at least one of an acrylic-based resin, an epoxy resin, a phenol resin, a polyamide-based resin, a polyimide-based resin, an unsaturated polyester resin, a polyphenylene-based resin, polyphenylene sulfide-based resin, etc. But this is not limited thereto.

According to an example embodiment of the present disclosure, the OLED device 100 may include the plurality of planarization layers 105-1 and 105-2 because the numbers of various lines and elements increases as the resolution of the OLED device 100 becomes higher. That is, in a high-resolution OLED device, a larger number of lines and elements may be disposed in a narrower space. Thus a space for disposing lines and elements can be increased using the plurality of planarization layers 105-1 and 105-2. Accordingly, by disposing various metal layers such as the connection electrode 114-1 between the first planarization layer 105-1 and the second planarization layer 105-2, it is possible to make the lines, electrodes and elements easier. Also, when a dielectric material is used for the first planarization layer 105-1 and the second planarization layer 105-2, the first planarization layer 105-1 and/or the second planarization layer 105-2 may be used for forming a capacitance of a capacitor between metal layers.

The organic light-emitting element 130 is disposed on the plurality of planarization layers 105-1 and 105-2. Specifically, the organic light-emitting element 130 is disposed on the second planarization layer 105-2 in the active area A/A. The organic light-emitting element 130 includes an anode 131, an organic emission layer 132 on the anode 131, and a cathode 133 on the organic emission layer 132.

The anode 131 may be electrically connected to the drain electrode 114 of the thin-film transistor 110 via the connection electrode 114-1. When the OLED device 100 is a top-emission OLED device, the anode 131 may be formed of a reflective layer having high reflectance and a transparent conductive layer on the reflective layer. But this is not limited thereto. In addition, when the OLED device 100 is a top-emission OLED device, the cathode 133 may be formed of a transparent conductive layer and may be formed of a very thin metal material. But this is not limited thereto.

The organic emission layer may be comprised of a single emissive layer emitting light of one color or multiple emissive layers emitting white light. In addition to the organic emission layer 132, an electron injection layer, an electron transport layer, a hole transport layer, a hole injection layer, etc. may be further disposed. Further, the organic emission layer 132 may be formed in each of the pixels or may be formed throughout the entire active area A/A. When the organic emission layer 132 of the organic light-emitting element 130 emits white light, a color filter may be formed on or under the organic light-emitting element 130.

A bank 106 is disposed on the second planarization layer 105-2 in the active area A/A except the emission area. That is, the bank 106 may cover the anode 131 partially so as to expose some part of the anode 131. Thus the exposed part of the anode 131 may be defined as the emission area. The bank 106 may be made of an inorganic insulative material such as silicon oxide and silicon nitride or an organic insulative material such as BCB, acryl-based resin or imide-based resin. But this is not limited thereto.

A spacer 107 is disposed on the bank 106. The spacer 107 serves to avoid a fine metal mask (FMM) used in forming the organic emission layer 132 of the organic light-emitting element 130 from being directly in contact with the bank 106 or the anode 131. Therefore, the spacer 107 can avoid the organic light-emitting element 130 from being damaged. The spacer 107 may be made of either the same material as or a different material from that of the bank 106. Further, the spacer 107 and the bank 106 may be formed together during the same process. The cathode 133 may be disposed to cover the spacer 107 and the bank 106 as the spacer 107 is disposed on the bank 106.

The encapsulation layer 120 may be disposed on the organic light-emitting element 130 to cover it. The encapsulation layer 120 is disposed on the first planarization layer 105-1 and the second planarization layer 105-2. The encapsulation layer 120 minimizes oxygen and moisture permeating into the organic light-emitting element 130, various electrodes and lines. For example, the encapsulation layer 120 can protect from occurring a pixel shrinking that is emission area is reduced, or black spots in the emission area as the organic light-emitting element 130 is exposed to moisture or oxygen.

The encapsulation layer 120 includes a first inorganic layer 121, an organic member (or first organic member or first organic member) 122 on the first inorganic layer 121, and a second inorganic layer 123 on the organic member 122. Specifically, the organic member 122 is disposed between the first inorganic layer 121 and the second inorganic layer 123. The organic member 122 may be surrounded by the first inorganic layer 121 and the second inorganic layer 123. The first inorganic layer 121 and the second inorganic layer 123 serve to suppress (or minimize) the permeation of moisture or oxygen. The organic member 122 covers lines, electrodes, elements, etc. to provide the flat surface of the second inorganic layer 123. As described above, by configuring the encapsulation layer 120 with the plurality of inorganic layers 121 and 123 and the organic member 122, the path via which moisture or oxygen would pass becomes longer and more complicated. Therefore it is possible to prevent or delay as late as possible the permeation of moisture or oxygen.

The first inorganic layer 121 is made of an inorganic material. For example, the first inorganic layer 121 may be made of an inorganic material such as one of silicon oxide ($SiO_2$), silicon nitride ($SiN_x$) and aluminum oxide (AlOz). The first inorganic layer 121 may be formed by, but is not limited to, a vacuum deposition method such as chemical vapor deposition (CVD) or atomic layer deposition (ALD).

The organic member (or first organic member or first organic member) 122 may cover lines, electrodes, elements, etc. The organic member 122 may cover foreign matters or particles that may be possible during the fabricating process. The organic member 122 may be made of an organic material, for example, silicon oxycarbon (SiOCz) acryl or epoxy-based resin. The organic member 122 may be formed by various coating methods such as inkjet coating, slit coating, etc.

The second inorganic layer 123 is made of an inorganic material. For example, the second inorganic layer 123 may be made of an inorganic material such as one of silicon oxide, silicon nitride and aluminum oxide. The second inorganic layer 123 may be formed by a vacuum deposition method such as chemical vapor deposition or atomic layer deposition. But this is not limited thereto.

The barrier film 140 is disposed on the encapsulation layer 120. The barrier film 140 encapsulates the elements thereunder including the organic light-emitting element 130. The barrier film 140 may be a retarded film or an optically isotropic film, for example. If the barrier film 140 has optically isotropic property, it transmits incident light without phase retardation. In addition, an organic film or an inorganic film may be further disposed on or under the barrier film 140. The organic film or the inorganic film formed on or under the barrier film 140 may suppress (or minimize) permeation of moisture or oxygen.

An adhesive layer 145 may be disposed between the barrier film 140 and the encapsulation layer 120. The adhesive layer 145 attaches the barrier film 140 to the encapsulation layer. The adhesive layer 145 may be a heat-curable, light-curable or naturally-curable adhesive. For example, the adhesive layer 145 may be made of a material such as B-PSA (Barrier pressure sensitive adhesive). A polarizing film, a top cover, etc. may be further disposed on the barrier film 140. In some example embodiments, the barrier film 140 and the adhesive layer 145 may be eliminated.

Figure 3:
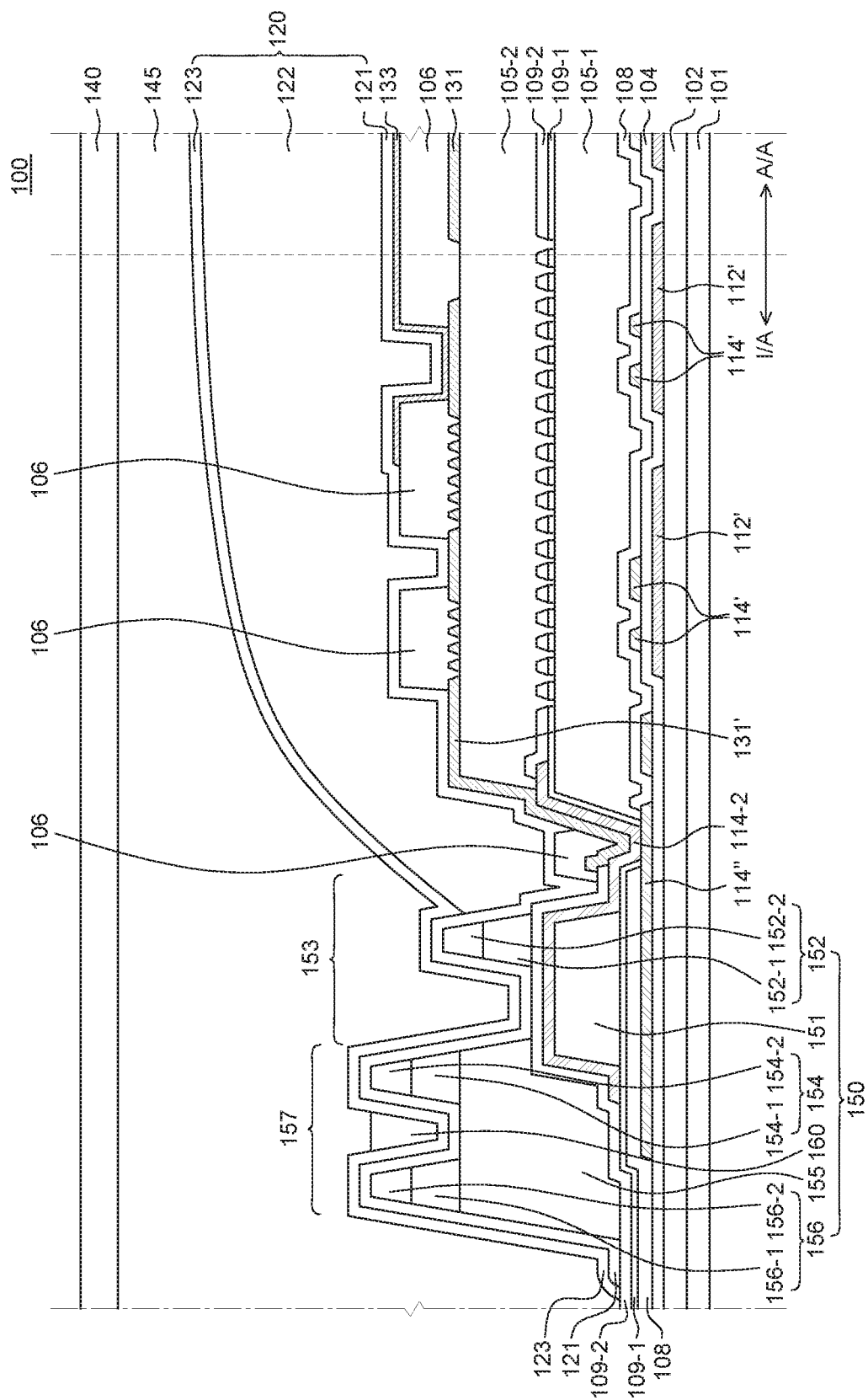
FIG. 3 is a cross-sectional view of a portion of an active area and an inactive area of an OLED device according to an example embodiment of the present disclosure.

FIG. 3 is a cross-sectional view of a portion of an active area and an inactive area of an OLED device according to an example embodiment of the present disclosure. FIG. 3 shows a portion of the active area A/A and the inactive area I/A of the OLED device 100. The identical elements described above with reference to FIG. 2 will be omitted.

As shown in FIG. 3, the circuit elements 112' and 114' are disposed on the substrate 101 in the active area A/A and the inactive area I/A. The circuit elements 112' and 114' may be made of the same material as the conductive material constituting the thin-film transistor 110 formed in the active area A/A. For example, the circuit elements 112' and 114' may be made of the same material as the gate electrode 112, the source electrode 113 and the drain electrode 114 of the thin-film transistor 110 during the same process. The circuit part 112' and 114' may include, for example, a GIP (Gate In Panel) and various lines.

Various insulating layers may be formed on the circuit elements 112' and 114'. For example, the first planarization layer 105-1 and the second planarization layer 105-2 may be extended from the active area A/A to the inactive area I/A. The first planarization layer 105-1 may be disposed above the circuit elements 112' and 114' disposed in the active area A/A and the inactive area I/A. The second planarization layer 105-2 may be disposed on the first planarization layer 105-1.

On the first planarization layer 105-1, metal layers having various functions such as the connection electrode 114-1 as shown in FIG. 2 or a second connection line 114-2 as shown in FIG. 3 may be disposed. Inorganic layers 109-1 and 109-2 for disposing and protecting metal layers may be disposed on the first planarization layer 105-1. For example, the inorganic layers 109-1 and 109-2 may be buffer layers and protective layers made of an inorganic material, for example. The inorganic layers 109-1 and 109-2 may include an opening for out-gassing gas generated in the first planarization layer 105-1. In some embodiments, the inorganic layers 109-1 and 109-2 may be eliminated.

In the inactive area I/A, a power line 114" is disposed on a further outer side than the circuit elements 112' and 114'. The power line 114" may be, for example, a ground voltage (Vss) line. Although the power line 114" is made of the same material as the source electrode 113 and the drain electrode 114, this is merely illustrative. It may be made of the same material as the gate electrode 112. The first planarization layer 105-1 is disposed above the circuit elements 112' and 114' to provide a flat surface over the circuit elements 112' and 114'.

When the power line 114" is the ground voltage (Vss) line, the power line 114" is electrically connected to the cathode 133 in the inactive area I/A. Specifically, the cathode 133 comes in contact with a first connection line 131', which is made of the same material as the anode 131. The first connection line 131' come in contact with the second connection line 114-2 which is made of the same material as the connection electrode 114-1. As the second connection line 114-2 comes in contact with the power line 114", the power line 114" can be electrically connected to the cathode 133. The first connection line 131' may include an opening for out-gassing gas generated in the first planarization layer 105-1 and the second planarization layer 105-2.

A dual-buffer structure 150 may be disposed at an outer periphery of the planarization layer 105-1, 105-2 in the inactive area I/A. A dual-buffer structure 150 may be disposed apart from the first planarizing layer 105-1 and the second planarizing layer 105-2 in the inactive area I/A. The double buffer structure 150 reduces the height difference between the top of the dual-buffer structure 150 and the top of the organic member 122 (or the first organic member 122) of the encapsulation layer 120, thereby suppressing (or minimizing) the overflow of the organic member 122. The height of the dual-buffer structure 150 may be adjusted by at least one sub-layer and at least one wall disposed on the at least one sub-layer. The one sub-layer may be made of the same material as the first planarization layer 105-1 or the second planarization layer 105-2.

In addition, the dual-buffer structure 150 may include a second organic layer 160 (or second organic member) in a gap of the double-buffer structure 150 to provide an even top surface. As used herein, the term "the even top surface" means a substantially flat surface having a certain degree of flatness such that a conductive layer can be formed normally thereon without being disconnected even with some level difference.

The width of the gap of the dual-buffer structure 150 may be determined by the distance between the at least one sub-layer and another sub-layer disposed at the outer periphery of the at least one sub-layer. The top surface of the dual-buffer structure 150 may be formed by filling between a wall on the at least one sub-layer and an additional wall disposed on the another sub-layer, with the second organic layer 160.

The double-buffer structure 150 includes a first structure 153 having a first wall 152, a second structure 157 disposed on a further outer side than the first structure 153 in the inactive area I/A and having a second wall 156, and the second organic member 160. The second organic member 160 is disposed in a space between the first wall 152 and the second wall 156.

The first structure 153 includes a first support layer 151 and the first wall 152. The first support layer 151 may be formed of the same material as the first planarization layer 105-1 or the second planarization layer 105-2 during the same manufacturing process such that it is spaced apart from the first planarization layer 105-1. The first support layer 151 may work as a sub-layer to increase the height of the first structure 153. The first structure 153 may have the first wall 152 disposed on the first support layer 151. Consequently, the height of the first structure 153 can be increased, such that it is possible to suppress the organic material from overflowing during the process of forming the first organic member 122 of the encapsulation layer 120. That is, by adjusting the height of the dual-buffer structure 150, it is possible to prevent the organic material from being excessively applied to the outside of the substrate 101 during the manufacturing process of the organic member 122. Therefore, the dual-buffer structure 150 controls the flow of the organic material, such that a region where the organic material is applied to form the organic member 122 is formed can be defined.

The first wall 152 may be made of the same material as one or more insulating patterns disposed in the active area A/A. For example, the first wall 152 may include a lower layer 152-1 made of the same material as the bank 106, and an upper layer 152-2 made of the same material as the spacer 107. The lower layer 152-1 of the first wall 152 may be made of the same material as and together with the bank 106, and the upper layer 152-2 of the first wall 152 may be made of the same material as and together with the spacer 107. However, this is merely illustrative. For example, the lower layer 152-1 of the first wall 152 may be made of the same material as the second planarization layer 105-2, and the upper layer 152-2 of the first wall 152 may be made of the same material as the bank 106 or the spacer 107. In addition, the first wall 152 may include a lower layer 152-1 made of the same material as the second planarization layer 105-2, an intermediate layer made of the same material as the bank 106, and an upper layer 152-2 made of the same material as the spacer.

The second structure 157 may be disposed at an outer periphery of the first structure 153 in the inactive area I/A. The second structure 157 includes a second support layer 155 and the second wall 156. In one embodiment, it also includes a third wall 154. The second support layer 155 may be formed of the same material as the first planarization layer 105-1 or the second planarization layer 105-2 during the same manufacturing process. The second support layer 155 may work as a sub-layer to increase the height of the second structure 157.

The second wall 156 is disposed on the second support layer 155. The configuration and functionality of the second wall 156 are identical to those of the first wall 152, and thus redundant description will be omitted.

The second organic member 160 is disposed in a space between the first wall 152 and the second wall 156. The second organic member 160 may be made of a material capable of provide a flat surface over the structures 153 and 157. For example, the second organic member 160 may be made of an organic material and may be made of the same material as the first organic member 122 of the encapsulation layer 120. If the second organic member 160 may be made of the same material as the organic member 122 of the encapsulation layer 120. When the second organic member 160 is made of the same material as the organic member 122 of the encapsulation layer 120, the second organic member 160 may be formed by an inkjet coating. That is, the width of the gap of the dual-buffer structure 150 may be adjusted to obtain a space for disposing the second organic member 160, and the second organic member 160 may be applied in the space to form the top surface of the dual-buffer structure 150. In this manner, the dual-buffer structure 150 can provide an even top surface in the inactive area I/A.

As shown in FIG. 3, the second structure 157 may be higher than the first structure 153. In addition, the second structure 157 may overlap with the first structure 153. In addition, the second structure 157 may include a third wall 154. The third wall 154 may be disposed at an inner side of the second wall 166 on the second support layer 155. In addition, the third wall 154 may be disposed at an outer periphery of the first wall 154 on the first support layer 151. The configuration and functionality of the third wall 154 are identical to those of the first wall 152, and thus redundant description will be omitted.

The second organic member 160 disposed between the first wall 152 and the second wall 156, specifically, may fill the space between the second wall 156 and the third wall 154.

The second organic member 160 may be disposed on the second structure 157 and may fill the space between the second wall 156 and the third wall 154. In addition, when the first inorganic layer 121 and the second inorganic layer 123 of the encapsulation layer 120 are disposed such that they cover the first support layer 151 and the first wall 152 of the first structure 153 and the second support layer 155, the second wall 156 and the third wall 154 of the second structure 157, the second organic member 160 may be disposed on the first inorganic layer 121 and the second inorganic layer 123 between the second wall 156 and the third wall 154, to fill the space between the second wall 156 and the third wall 154.

The second organic member 160 may provide an even top surface in the inactive area I/A. As OLED devices have smaller size and higher resolution, the number of required lines, electrodes, elements, etc. are increased. However, the space for disposing lines, electrodes, elements, etc. are insufficient. Particularly, in the inactive area I/A, various components are disposed, such that there are many steep level differences. When a line is disposed along a steep level difference, the lines may not be normally formed or may be disconnected. To overcome this, an additional even area can be provided in the inactive area I/A using the first structure 153, the second structure 157 and the second organic member 160 so as to provide an additional space for disposing various lines. By doing so, it is possible to avoid disconnection of lines, and to reduce the size of the inactive area I/A for providing a space for disposing the lines.

The first support layer 151 and the first wall 154 of the first structure 153 and the second support layer 155, the second wall 156 and the third wall 154 of the second structure 157 may be made of the same material as an insulating pattern disposed in the active area A/A. Therefore, the first structure 153 and the second structure 157 can be formed together during the manufacturing process of the insulating pattern disposed in the active area A/A. As a result, the process for fabricating the first structure 153 and the second structure 157 can be simplified.

In addition, the second organic member 160 may be made of the same material as the organic member 122 of the encapsulation layer 120. Accordingly, the second organic member 160 may be manufactured by using the same manufacturing equipment as that used for manufacturing the organic member 122 of the encapsulation layer 120. As a result, it is possible to simplify a process for fabricating the second organic member 160 to suppress the overflow of the organic member 122 of the encapsulation layer 120 and provide an even top surface. In addition, the fabricating cost can also be reduced.

Figure 4:
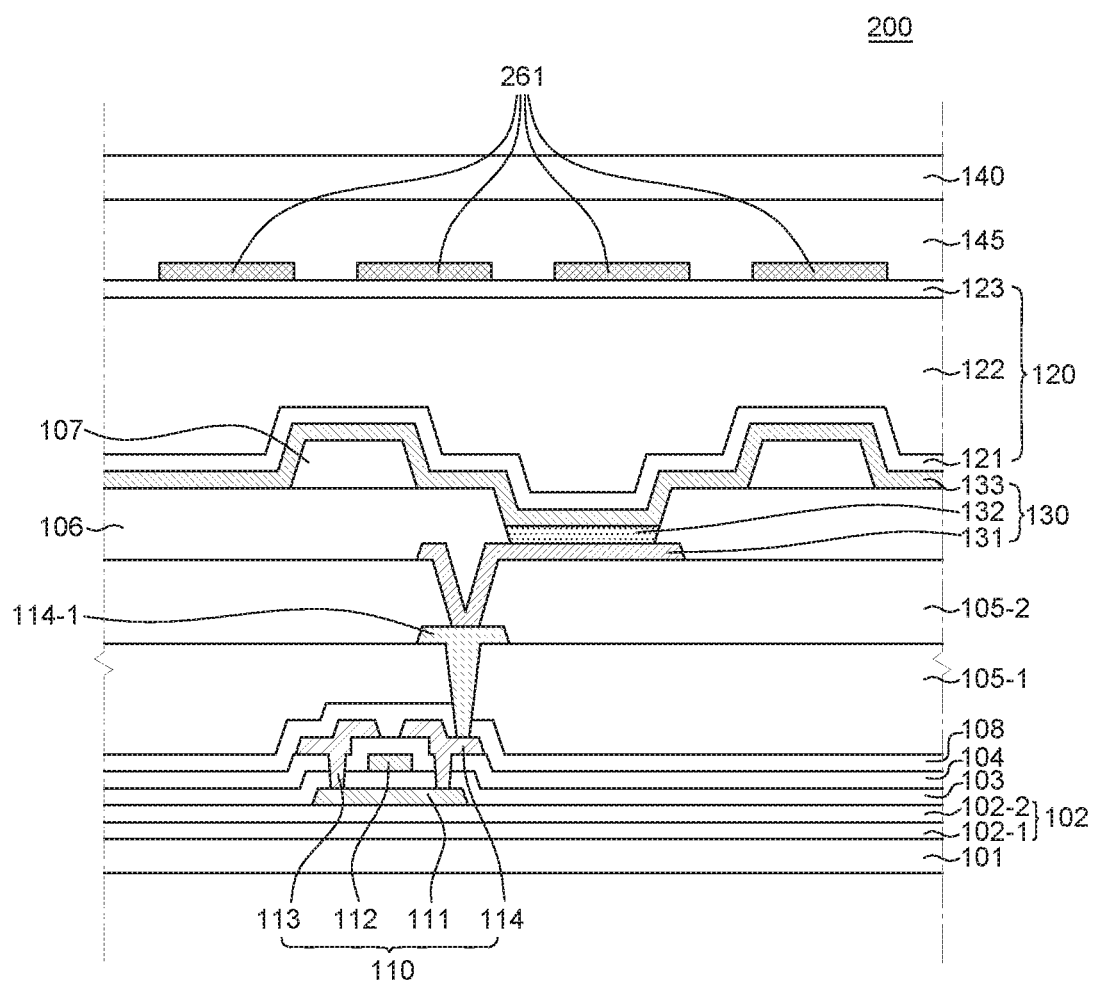
FIG. 4 is a cross-sectional view of a portion of an active area of an OLED device according to another example embodiment of the present disclosure.
Figure 5:
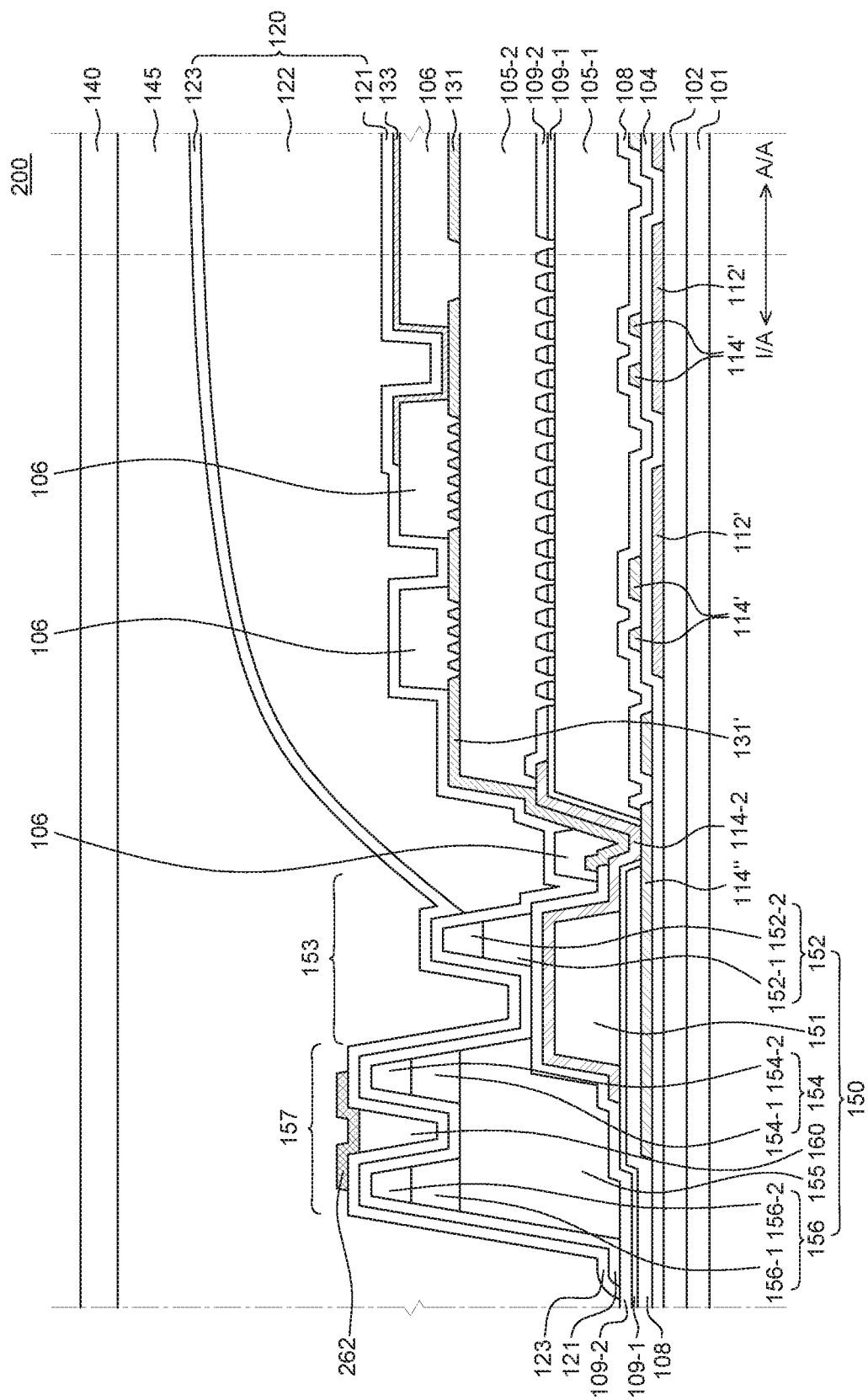
FIG. 5 is a cross-sectional view of a portion of an active area and an inactive area of an OLED device according to another example embodiment of the present disclosure.

FIG. 4 is a cross-sectional view of a portion of an active area of an OLED device according to another example embodiment of the present disclosure. FIG. 5 is a cross-sectional view of a portion of an active area and an inactive area of an OLED device according to another example embodiment of the present disclosure. The OLED device 200 shown in FIGS. 4 and 5 is substantially identical to the OLED device 100 shown in FIGS. 1 to 3 except for that a plurality of touch sensing electrodes 261 is disposed on the encapsulation layer 120 and a touch line 262 is disposed on the dual-buffer structure 150; and, therefore, the redundant description will be omitted.

As shown in FIG. 4, a plurality of conductive patterns may be disposed on the encapsulation layer 120 in the active area A/A. The plurality of conductive patterns may be a plurality of touch sensing electrodes 261. That is, the plurality of touch sensing electrodes 261 is formed on the second inorganic layer 123 of the encapsulation layer 120. As shown in FIG. 4, the plurality of touch sensing electrodes 261 may be formed in the form of a plurality of blocks. In this case, the plurality of touch sensing electrodes 261 may be made of a transparent conductive material such as ITO. In some embodiments, the plurality of touch sensing electrodes 261 may be made as a metal mesh. That is, each of the plurality of touch sensing electrodes 261 may be made of a metal material, and may be arranged in the form of a mesh in a plane.

As shown in FIG. 5, a conductive layer may be disposed on the second structure 157 disposed in the inactive area I/A. The conductive layer may be the touch line 262. The touch line 262 may be electrically connected to the touch sensing electrodes 261 disposed in the active area A/A to transmit/receive a signal to/from the touch sensing electrodes 261.

In the OLED device 200 according to this example embodiment of the present disclosure, the touch sensing electrodes 261 can be formed directly on the encapsulation layer 120 instead of attaching an additional touch panel. Therefore, the process of forming the touch sensing electrodes 261 can be simplified as compared with fabricating and attaching an additional touch panel, and a light and thin OLED device can be produced.

In addition, in the OLED device 200 according to this example embodiment of the present disclosure, the second organic member 160 provides an even top surface. Accordingly, the conductive layer such as the touch line 262 can be formed on the second organic member 160 without being disconnected or damaged by a level difference in the inactive area I/A. As a result, the touch line 262 can be fabricated reliably, and a space for forming the touch line 262 can be created, such that the size of the inactive area I/A can be reduced.

Figure 6:
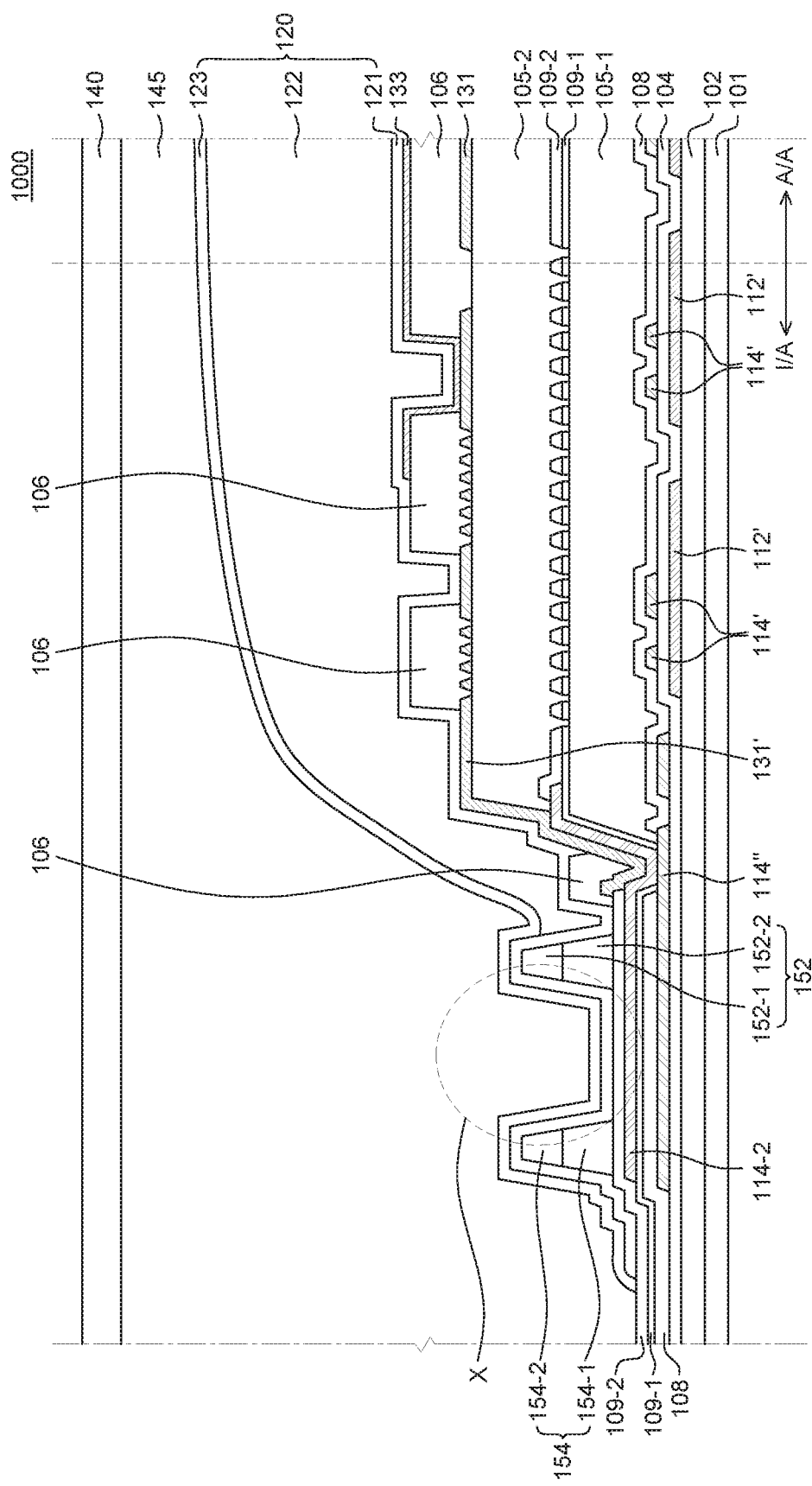
FIG. 6 is a cross-sectional view of a portion of an active area and an inactive area of an OLED device according to Comparative Example.

FIG. 6 is a cross-sectional view of a portion of an active area and an inactive area of an OLED device according to Comparative Example. The OLED device 1000 according to Comparative Example shown in FIG. 6 is substantially identical to the OLED device 100 shown in FIGS. 4 and 5 except for the structure disposed in the inactive area I/A; and, therefore, the redundant description will be omitted.

As shown in FIG. 6, in the OLED device 1000 according to Comparative Example, only the first wall 152 and the second wall 154 were disposed in the inactive area I/A. Accordingly, in the OLED device 1000, the organic matter is likely to overflow during the process of forming the organic member 122 of the encapsulation layer 120, compared to the OLED device 100 including the dual-buffer structure 150 shown in FIGS. 4 and 5.

In addition, in the OLED device 1000 according to Comparative Example, the second organic member 160 filling the space between the first wall 152 and the second wall 154 is not provided. As a result, in the OLED device 1000, there is an area X where a steep level difference exists by the first wall 152 and the second wall 154. Accordingly, in the OLED device 1000, if a conductive layer such as the touch line 262 is formed along the first wall 152 and the second wall 154, the conductive layer is likely to be disconnected or fail to be formed normally. In the OLED device 1000, a conductive layer such as the touch line 262 may be disposed on a further outer side than the second wall 154. As a result, the size of the inactive area I/A of the OLED device 1000 may increase.

In contrast, the OLED devices 200 shown in FIGS. 4 and 5 are different from the OLED device 1000 in that they further include the dual-buffer structure 150, such that it is possible to suppress the organic material from being excessively applied out of the substrate 101 during the manufacturing process of the organic member 122 of the encapsulation layer 120. In addition, the OLED devices 200 shown in FIGS. 4 and 5 can provide an additional even area in the inactive area I/A to provide additional space for disposing various lines.

Figure 7:
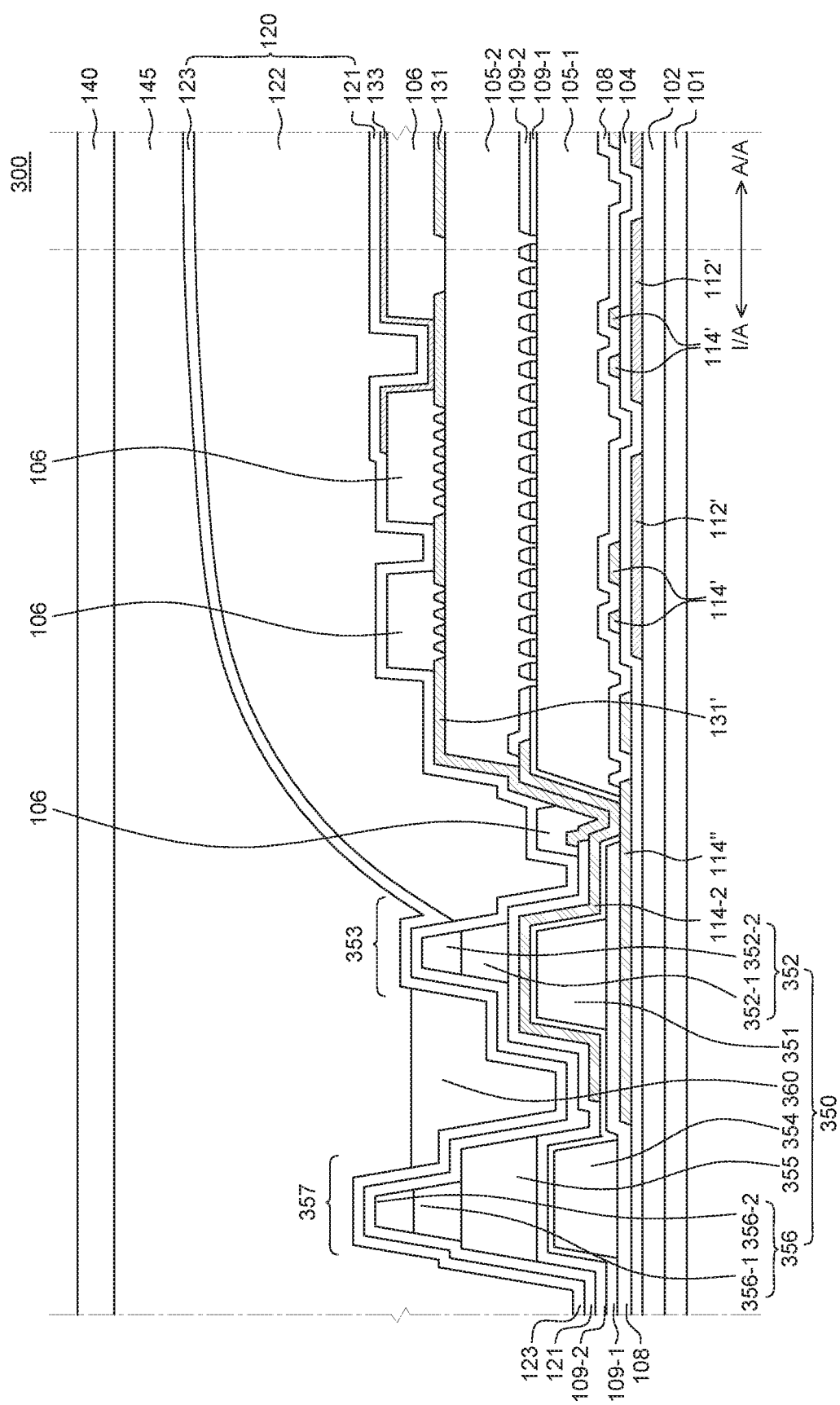
FIGS. 7 to 9 are cross-sectional views of a portion of an active area and an inactive area of an OLED device according to example embodiments of the present disclosure.
Figure 8:
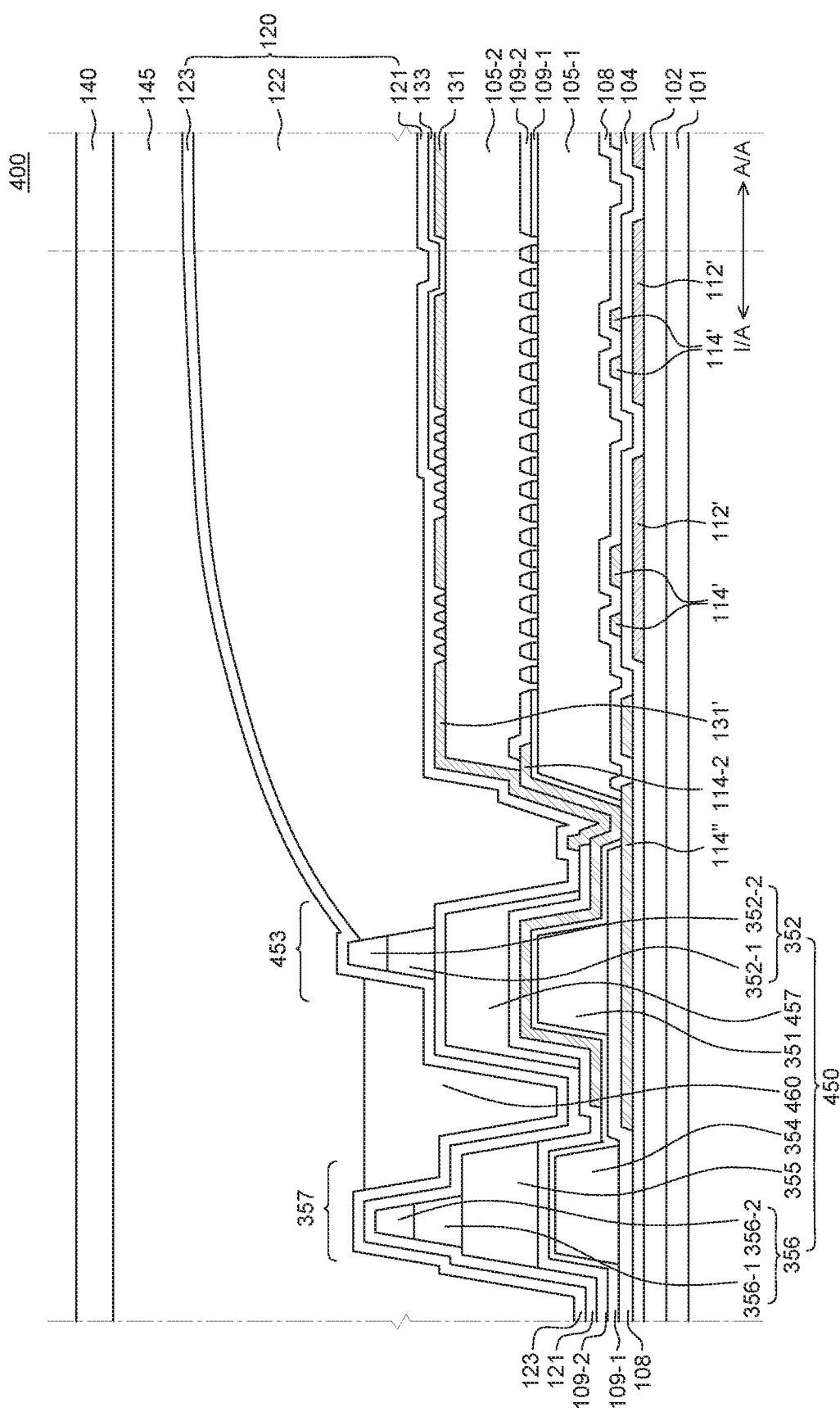
Figure 9:
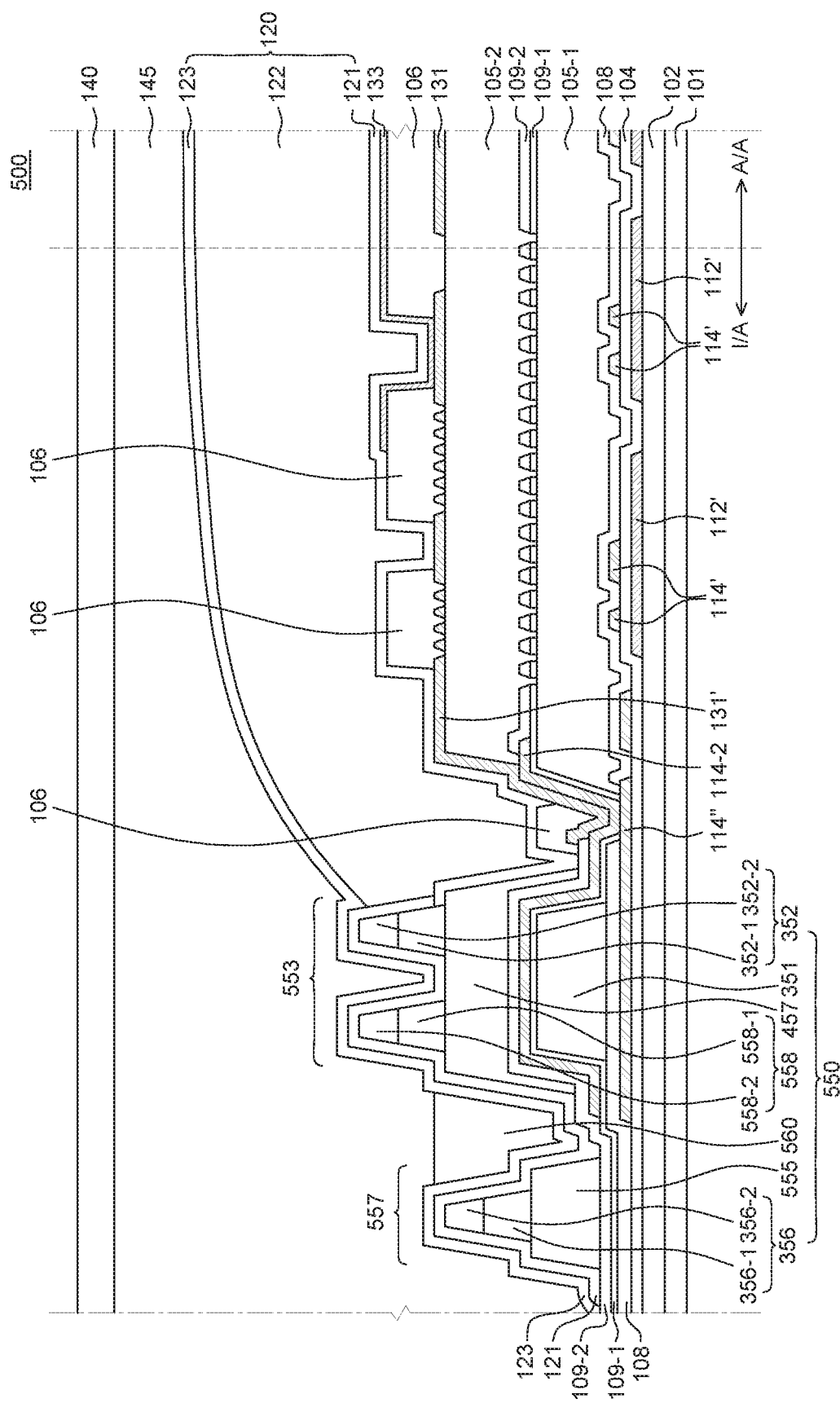

FIGS. 7 to 9 are cross-sectional views of a portion of an active area and an inactive area of OLED devices according to example embodiments of the present disclosure.

FIG. 7 is a cross-sectional view of a portion of an active area and an inactive area of an OLED device according to yet another example embodiment of the present disclosure. An OLED device 300 shown in FIG. 7 is substantially identical to the OLED device 100 shown in FIGS. 1 to 3 except for a second structure 357 of a dual-buffer structure 350 and a second organic member 360; and, therefore, the redundant description will be omitted.

As shown in FIG. 7, the dual-buffer structure 350 may be disposed apart from the outer periphery of the first planarizing layer 105-1 and the second planarizing layer 105-2 in the inactive area I/A. The double-buffer structure 350 includes a first structure 353 having a first support layer 351 and a first wall 352, a second structure 357 disposed at an outer periphery of the first structure 353 in the inactive area I/A and having a second wall 356, and the second organic member 360.

The second structure 357 may include a second support layer 354, a third support layer 355 and a second wall 356. The second wall 356 includes a lower layer 356-1 and an upper layer 356-2. The lower layer 356-1 of the second wall 356 and the upper layer 356-2 of the second wall 356 are also illustrated in FIGS. 8 and 9.

The second support layer 354 may be formed of the same material as the first planarization layer 105-1 or the second planarization layer 105-2 during the same manufacturing process. The second support layer 354 may work as a sub-layer to increase the height of the second structure 357.

The third support layer 355 may be disposed under the second support layer 354 or between the second support layer 354 and the second wall 356. Accordingly, the third support layer 355 may work as a sub-layer to further increase the height of the second structure 357. Consequently, the height of the dual-buffer structure 153 can be further increased, such that it is possible to suppress the organic material from overflowing during the process of forming the organic member 122 of the encapsulation layer 120.

The third support layer 355 may be formed of the same material as the first planarization layer 105-1 or the second planarization layer 105-2 during the same manufacturing process. It is to be noted that the third support layer 355 may be formed in a processing step different from the processing step of forming the second support layer 354. That is, the third support layer 355 is not formed together with the second support layer 354. Accordingly, the third support layer 355 may be made of a different material from that of the second support layer 354.

The location of the second wall 356 may vary depending on the locations of the second support layer 354 and the third support layer 355. When the third support layer 355 is formed on the second support layer 354, the second wall 356 is disposed on the third support layer 355. When the second support layer 354 is formed on the third support layer 355, the second wall 356 is disposed on the second support layer 354. The configuration and functionality of the second wall 356 are identical to those of the first wall 152 of the first structure 353, and thus redundant description will be omitted.

The second structure 357 is spaced apart from the first structure 353 to provide a space between the first structure 353 and the second structure 357. The second organic member 360 is disposed between the first structure 353 and the second structure 357 to fill the space therebetween. Specifically, the second organic member 360 may fill the space between the first wall 352 and the second wall 356. As a result, the top surface of the second organic member 360 can become larger than that of the second organic member when the first structure 353 overlaps with the second structure 357. A conductive layer such as a touch line may be disposed on the second organic member 360 of the dual-buffer structure 350, and a touch sensing electrode may be disposed on the encapsulation layer 120 in the active area A/A. Accordingly, it is possible to provide a larger area for disposing a conductive layer such as the touch line connected to the touch sending electrodes.

FIG. 8 is a cross-sectional view of a portion of an active area and an inactive area of an OLED device according to yet another example embodiment of the present disclosure. An OLED device 400 shown in FIG. 8 is substantially identical to the OLED device 300 shown in FIG. 7 except for a first structure 453 of a dual-buffer structure 450 and a second organic member 460; and, therefore, the redundant description will be omitted.

As shown in FIG. 8, the dual-buffer structure 450 may be disposed apart from the outer periphery of the first planarizing layer 105-1 and the second planarizing layer 105-2 in the inactive area I/A. The double-buffer structure 450 includes a first structure 453 having a first wall 352, a second structure 357 disposed at an outer periphery of the first structure 453 in the inactive area I/A and having a second wall 356, and the second organic member 460.

The first structure 453 may include a first support layer 351, a fourth support layer 457 and a first wall 352.

The first support layer 351 may be formed of the same material as the first planarization layer 105-1 or the second planarization layer 105-2 during the same manufacturing process. The first support layer 351 may work as a sub-layer to increase the height of the first structure 453.

The fourth support layer 457 may be disposed under the first support layer 351 or between the first support layer 351 and the first wall 352. Accordingly, the fourth support layer 457 may work as a sub-layer to further increase the height of the first structure 453.

The fourth support layer 457 may be formed of the same material as the first planarization layer 105-1 or the second planarization layer 105-2 during the same manufacturing process. It is to be noted that the fourth support layer 457 may be formed in a processing step different from the processing step of forming the first support layer 351. That is, the fourth support layer 457 is not formed together with the first support layer 351. Accordingly, the fourth support layer 457 may be made of a different material from that of the first support layer 351.

The location of the first wall 352 may vary depending on the locations of the first support layer 351 and the fourth support layer 457. When the fourth support layer 457 is formed on the first support layer 351, the first wall 352 is disposed on the fourth support layer 457. Here, the first wall 352 is also disposed on the first support layer 351 located below the fourth support layer 457. The configuration and functionality of the first wall 352 are identical to those of the second wall 356 of the second structure 357, and thus redundant description will be omitted.

The first structure 453 may be disposed closer to the first planarization layer 105-1 than the second structure 357 is. The first structure 453 may include a first support layer 351, a fourth support layer 457 and a first wall 352. Accordingly, the top surface of the first wall 352 of the first structure 453 may be higher than the top surface of the second planarization layer 105-2. Consequently, the height of the dual-buffer structure 450 can be increased, such that the organic material can fill between the first structure 453 and the first planarization layer 105-1 during the manufacturing process of the organic member 122 of the encapsulation layer 120. Accordingly, the first wall 352 of the first structure 453 reduces the organic material from going over the first wall 352 during the process of forming the organic member 122, so that overflow of the organic material can be suppressed.

The second structure 357 is spaced apart from the first structure 453 to provide a space between the first structure 453 and the second structure 357. The second organic member 460 may fill the space between the first structure 453 and the second structure 357. Specifically, the second organic member 460 may fill the space between the first wall 352 and the second wall 356. As a result, an upper portion of the second organic member 460 can become larger than a lower portion of the second organic member. A conductive layer such as a touch line may be disposed on the second organic member 460 of the dual-buffer structure 450, and a touch sensing electrode may be disposed on the encapsulation layer 120 in the active area A/A. Accordingly, it is possible to provide a larger area for disposing a conductive layer such as the touch line connected to the touch sending electrodes.

FIG. 9 is a cross-sectional view of a portion of an active area and an inactive area of an OLED device according to yet another example embodiment of the present disclosure. An OLED device 500 shown in FIG. 9 is substantially identical to the OLED device 400 shown in FIG. 8 except for that a first structure 553 of a dual-buffer structure 550 further include a fourth wall 558, and that a second structure 557 of the dual-buffer structure 550 and a second organic layer 560 are modified, and, therefore, the redundant description will be omitted.

As shown in FIG. 9, the dual-buffer structure 550 may be disposed apart from the outer periphery of the first planarizing layer 105-1 and the second planarizing layer 105-2 in the inactive area I/A. The double-buffer structure 550 includes a first structure 553 having a first support layer 351, a first wall 352, a fourth support structure 457 and a fourth wall 558. Structure 550 also includes a second structure 557 disposed at an outer periphery of the first structure 553 in the inactive area I/A and having a second wall 356, and a second organic member 560.

The location of the fourth wall 558 may vary depending on the locations of the first support layer 351 and the fourth support layer 457. When the fourth support layer 457 is formed on the first support layer 351, the fourth wall 558 is disposed on the fourth support layer 457. When the fourth support layer 457 is formed on the first support layer 351, the fourth wall 558 is disposed on the first support layer 351. The configuration and functionality of the fourth wall 558 are identical to those of the first wall 352 of the first structure 553, and thus redundant description will be omitted.

The fourth wall 558 may be disposed at an outer periphery of the first wall 352. Accordingly, there may be a space between the first wall 352 and the fourth wall 558 on the first support layer 351 or the fourth support layer 457. The first wall 352 of the first structure 553 reduces the organic material from going over the first wall 352 during the process of forming the organic member 122, so that overflow of the organic material can be suppressed. Even if the organic material forming the organic member 122 passes over the first wall 352, the organic material may fill the space between the first wall 352 and the fourth wall 558. Accordingly, the fourth wall 558 reduces the organic material forming the organic member 122 from overflowing out of the first structure 553, so that the overflow of the organic material can be further suppressed.

The second structure 557 may include a second support layer 555 and a second wall 356.

The second support layer 555 may be formed of the same material as the first planarization layer 105-1 or the second planarization layer 105-2 during the same manufacturing process. The second support layer 555 may work as a sub-layer to increase the height of the second structure 557.

The second wall 356 is disposed on the second support layer 555. The configuration and functionality of the second wall 356 are identical to those of the first wall 352 of the first structure 553, and thus redundant description will be omitted.

The second structure 557 is spaced apart from the first structure 553 to provide a space between the first structure 553 and the second structure 557. Accordingly, the second organic member 560 may fill the space between the first structure 553 and the second structure 557. Specifically, the second organic member 560 may fill the space between the first support layer 351 and the fourth support layer 457 of the first structure 553 and the second structure 557. As a result, the top surface of the second organic member 560 can become larger than that of the second organic member when the first structure 553 overlaps with the second structure 557. A conductive layer such as a touch line may be disposed on the second organic member 560 of the dual-buffer structure 550, and a touch sensing electrode may be disposed on the encapsulation layer 120 in the active area A/A. Accordingly, it is possible to provide a larger area for disposing a conductive layer such as the touch line connected to the touch sending electrodes.

The example embodiments of the present disclosure can also be described as follows:

According to an aspect of the present disclosure, an OLED device includes: a substrate comprising an active area and an inactive area surrounding the active area; a first planarization layer on circuit elements in the active area and in the inactive area; a second planarization layer on the first planarization layer; an organic light-emitting element on the second planarization layer in the active area; an encapsulation layer covering the organic light-emitting element, where the encapsulation layer comprises a first inorganic layer, a second inorganic layer and a first organic member between the first inorganic layer and the second inorganic layer; a first structure spaced apart from the first planarization layer in the inactive area and comprising a first support layer made of the same material as the first planarization layer or the second planarization layer, and a first wall on the first support layer; a second structure positioned an outer periphery of the first structure in the inactive area, where the second structure comprises a second support layer made of the same material as the first planarization layer or the second planarization layer, and a second wall on the second support layer; and a second organic member located in a space between the first wall and the second wall.

The second structure may be higher than the first structure and partially overlaps with the first structure.

The second structure may include a third wall, and the third wall may be positioned at an inner side of the second wall on the second support layer.

The second organic member may fill a space between the second wall and the third wall.

The OLED device may further include: a bank on the second planarization layer so that it partially covering an anode of the organic light-emitting element; and a spacer on the bank. Each of the first wall, the second wall and the third wall may include a lower layer made of the same material as the bank, and an upper layer made of the same material as the spacer.

The second structure may be spaced apart from the first structure to provide a space between the first structure and the second structure.

The second organic member may be positioned in the space.

The second structure may include a third support layer positioned under the second support layer or between the second support layer and the second wall.

The third support layer may be made of a material that is different from that of the second support layer and is the same as that of the first planarization layer or the second planarization layer.

The first structure may include a fourth support layer positioned under the first support layer or between the first support layer and the first wall.

A top surface of the first wall may be higher than a top surface of the second planarization layer for the first organic member to be minimized from flowing over the first wall.

The first structure may include a fourth wall, and the fourth wall may be positioned at an outer periphery of the first wall.

The fourth support layer may be made of a material that is different from that of the second support layer and is the same as that of the first planarization layer or the second planarization layer.

The OLED device may further include a conductive layer on the second organic member.

The OLED device may further include: a plurality of touch sensing electrodes on the encapsulation layer, wherein the conductive layer is a touch line connected to the plurality of touch sensing electrodes.

According to another aspect of the present disclosure, an organic light-emitting display (OLED) device includes: a substrate comprising an active area and an inactive area surrounding the active area; a planarization layer positioned in the active area and in the inactive area, comprising a plurality of layers; an organic light-emitting element on the planarization layer; an encapsulation layer covering the organic light-emitting element and comprising a first organic material; and a dual-buffer structure positioned at an outer periphery of the planarization layer in the inactive area. The dual-buffer structure reduces a height difference between a top surface of the dual-buffer structure and a top surface of the first organic material in the inactive area to suppress overflow of the first organic material, and the dual-buffer structure comprises a second organic material in a gap of the dual-buffer structure to make the top surface of the dual-buffer structure even.

A height of the dual-buffer structure may be determined by at least one sub-layer made of the same material as the planarization layer, and at least one wall on the at least one sub-layer.

The width of the gap may be determined by the distance between the at least one sub-layer positioned at an outer periphery of the at least one sub-layer.

The top surface of the dual-buffer structure may be formed by filling a space between the at least one wall and an additional wall on the another sub-layer, with the second organic material.

Thus far, example embodiments of the present disclosure have been described in detail with reference to the accompanying drawings. However, the present disclosure is not limited to the example embodiments, and modifications and variations can be made thereto without departing from the technical idea of the present disclosure. Accordingly, the example embodiments described herein are merely illustrative and are not intended to limit the scope of the present disclosure. The technical idea of the present disclosure is not limited by the example embodiments. Therefore, it should be understood that the above-mentioned embodiments are not restrictive, but are example in all aspects. The scope of protection sought by the present disclosure is defined by the appended claims and all equivalents thereof are construed to be within the true scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display (OLED) device, comprising:
a substrate having an active area and an inactive area adjacent to the active area;
a first planarization layer on circuit elements in the active area and in the inactive area;
a second planarization layer on the first planarization layer;
an organic light-emitting element on the second planarization layer in the active area;
an encapsulation layer covering the organic light-emitting element, the encapsulation layer including a first inorganic layer, a second inorganic layer and a first organic member between the first inorganic layer and the second inorganic layer;
a first structure spaced apart from the first planarization layer in the inactive area and including a first support layer made of a same material of at least one of the first planarization layer and the second planarization layer;
a first wall on the first support layer;
a second structure positioned at an outer periphery of the first structure in the inactive area and including a second support layer made of the same material of at least one of the first planarization layer and the second planarization layer;
a second wall on the second support layer; and
a second organic member,
wherein the second inorganic layer is on the first wall and the second wall, and the second organic member is on the second inorganic layer between the first wall and the second wall,
wherein the second inorganic layer is positioned between the first organic member and the second organic member.

2. The OLED device of claim 1, wherein the second structure is spaced apart from the first structure to provide a space between the first structure and the second structure.

3. The OLED device of claim 2, wherein the second organic member is positioned in the space.

4. The OLED device of claim 3, wherein the second structure comprises a third support layer positioned under the second support layer or between the second support layer and the second wall.

5. The OLED device of claim 4, wherein the third support layer is made of a material that is different from that of the second support layer and is the same as that of at least one of the first planarization layer and the second planarization layer.

6. The OLED device of claim 3, wherein the first structure comprises a fourth support layer positioned over the first support layer or between the first support layer and the first wall.

7. The OLED device of claim 6, wherein a top surface of the first wall is higher than a top surface of the second planarization layer to inhibit the first organic member from flowing over the first wall.

8. The OLED device of claim 6, wherein the fourth support layer is made of a material that is different from that of the second support layer and is the same as that of the first planarization layer or the second planarization layer.

9. The OLED device of claim 6, wherein the fourth support layer increases the height of the first structure.

10. An organic light-emitting display (OLED) device, comprising:
a substrate having an active area and an inactive area surrounding the active area;
a planarization layer positioned in the active area and in the inactive area, including a plurality of layers;
an organic light-emitting element on the planarization layer;
an encapsulation layer on the organic light-emitting element and including a first organic material and an inorganic layer on the first organic material;

a dual-buffer structure positioned at an outer periphery of the planarization layer in the inactive area, the dual-buffer structure including a first structure and a second structure, wherein the dual-buffer structure has a height to suppress overflow of the first organic material in the inactive area, wherein the inorganic layer extends over the dual-buffer structure; and a second organic material being on the inorganic layer and in a gap between the first structure and the second structure of the dual-buffer structure, wherein the second organic material fills the gap up to a top surface of the first structure, wherein the inorganic layer is positioned between the first organic material and the second organic material.

11. The OLED device of claim 10, wherein a height of the first structure and the second structure of the dual-buffer structure is determined by at least one sub-layer made of the same material as the planarization layer, and at least one wall on the at least one sub-layer.

12. The OLED device of claim 11, wherein a width of the gap is determined by a distance between the at least one sub-layer and another sub-layer positioned at an outer periphery of the at least one sub-layer.

13. The OLED device of claim 12, wherein the top surface of the dual-buffer structure is formed by filling a space between the at least one wall and an additional wall on the another sub-layer, with the second organic material.

* * * * *